Figure 1:
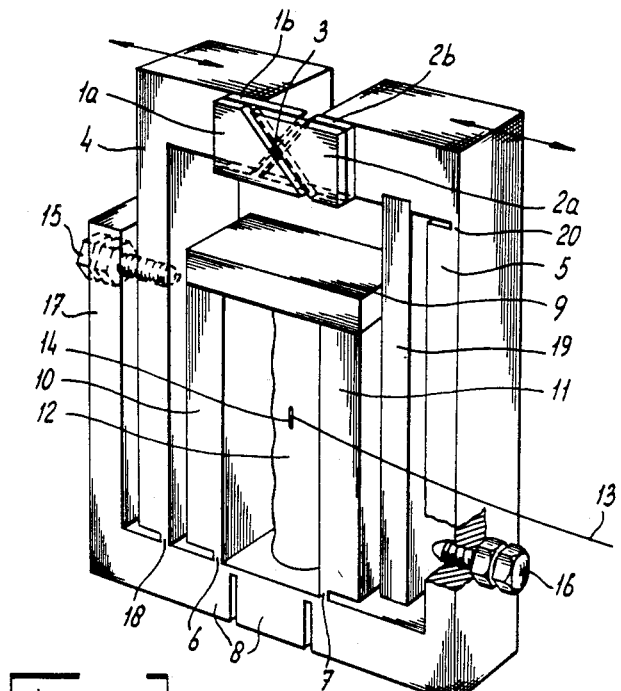

United States Patent [19]

Brakenhoff

[11] Patent Number: 4,880,294
[45] Date of Patent: Nov. 14, 1989

[54] CONTINUOUSLY VARIABLE MICRODIAPHRAGM

[75] Inventor: Godefridus J. Brakenhoff, Amsterdam, Netherlands

[73] Assignee: Stitchting Voor De Techische Wetenschappen, GA Utrecht, Netherlands

[21] Appl. No.: 159,696

[22] Filed: Feb. 24, 1988

[30] Foreign Application Priority Data

Feb. 27, 1987 [NL] Netherlands ........................ 8700496

[51] Int. Cl.[4] ...................... G02B 26/02; G02B 26/00; G02B 9/42
[52] U.S. Cl. .................................... 350/269; 350/271; 350/319
[58] Field of Search .................... 350/319, 162.11, 271, 350/272, 270, 269

[56] References Cited

U.S. PATENT DOCUMENTS

| | | | |
|---|---|---|---|
| 1,924,700 | 4/1933 | Thilo | 350/319 |
| 2,016,025 | 10/1935 | Scribner et al. | 350/272 |
| 2,043,292 | 6/1936 | Hillman | 350/319 |
| 2,795,170 | 6/1957 | Hansen et al. | 350/271 |
| 2,882,792 | 2/1959 | Levine | 350/319 |
| 2,914,987 | 12/1959 | Crosswhite et al. | 350/271 |
| 2,964,998 | 12/1960 | Middlestadt | 350/271 |
| 3,401,189 | 11/1968 | Spokowski | 350/271 |
| 4,017,162 | 4/1977 | Mills | 350/271 |
| 4,047,808 | 9/1977 | Bartlett | 350/271 |
| 4,572,659 | 2/1986 | Omata | 350/319 |

FOREIGN PATENT DOCUMENTS

| | | | |
|---|---|---|---|
| 1065244 | 5/1954 | France | 350/319 |
| 54191 | 11/1967 | German Democratic Rep. | 350/272 |
| 54-651 | 5/1979 | Japan | 350/272 |
| 58-80614 | 5/1983 | Japan | 350/319 |
| 1188543 | 10/1985 | U.S.S.R. | 350/319 |

OTHER PUBLICATIONS

N. Bolewski, "Neuartiger Aufbau eines Lichmodulators . . .", *Fernseh- und Kino-Technik*, 32, Jahrgang., No. 3, 1978, pp. 90–92 (350–272).

*Primary Examiner*—Jon W. Henry
*Attorney, Agent, or Firm*—Rosen, Dainow & Jacobs

[57] ABSTRACT

A continuously variable microdiaphragm has an aperture (3) which has a cross section and which has a shape which remains the same when the aperture becomes greater or smaller. The aperture is lozenge-shaped and is bounded by two recesses each disposed in a separable diaphragm strip (1a, 1b; 2a, 2b) Each of these strips is fixed on or forms part of a transmission leg (4, 5, 30, 31). These legs can be shifted symmetrically relative to each other.

13 Claims, 2 Drawing Sheets

CONTINUOUSLY VARIABLE MICRODIAPHRAGM

The invention relates to a continuously variable microdiaphragm having an aperture between 0.5 and 1,000 μm.

In modern electron microscopes and scanning microscopes diaghragms with a specific measurement are used. For many applications, such as regulation of the lighting intensity from a laser and variation of the resolution, it is desirable to have a microdiaphragm with an adjustable aperture available. One problem here is that the shape of the cross section of the aperture must remain in the same when the aperture becomes a greater or smaller. Moreover, it is not possible with the known designs of diaghragms to vary the aperture continuously to sizes of the order of 500 μm to 0.5 μm.

The invention provides the solution to this problem.

According to the invention, a lozenge-shaped aperture is bounded by two recesses, each disposed in a separate diaghragm strip, each of said strips being fixed on or forming part of a transmission leg, while means are present for shifting the transmission legs symmetrically relative to each other.

In principle, the recesses in each diaghragm strip could be lozenge-shaped, with the lozenges partially overlapping each other. However, it is simpler if the recesses are V-shaped and are disposed in the end edge of a diaghragm strip.

The cheapest and simplest design of each diaghragm strip consists of two plates which are fastened on each other and have slanting end edges, two slanting end edges lying behind one another so as to always forming a V-shaped recess.

The lozenge-shaped aperture becomes larger or smaller when the transmission legs are moved a small distance apart or towards each other in a controlled manner. An accurate and controllable displacement of the transmission legs can be achieved if each of the legs is a U-shaped lever and these levers are symmetrically connected by means of a tilting point to a tilting mechanism.

The tilting mechanism preferably comprises a rectangular bar structure with a bottom bar, two uprights standing perpendicular to said bottom bar and connected thereto and to the levers by means of a tilting point, and a bridge piece connected to the uprights and running parallel to the bottom piece, while an expandable member is placed between the bottom piece and the bridge piece.

The expandable member could be, for example, a hydraulic cylinder or an electromagnet. A better solution is, however, to utilize a column of piezoelectric material which is connected to an electrical current source.

It is necessary to adjust the outlet size of the aperture. For that reason an adjusting screw is added to each U-shaped lever.

A second embodiment has the advantage that a relatively great displacement of the displacement means (drive unit) can be converted into a relatively small variation of the aperture. For this embodiment, the transmission legs are connected by means of hinges to the legs to which a drive unit is added and which are connected by means of hinges to a block.

This device can be made easily and cheaply through the use of transmission legs, the legs to which the drive unit has to be added and the block being made in one piece through the provision of slits.

The invention will now be explained in greater detail with reference to the figures in which two embodiments are shown.

Figure 2:
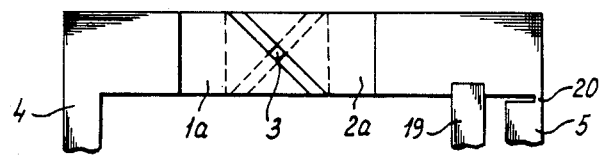
Figure 3:
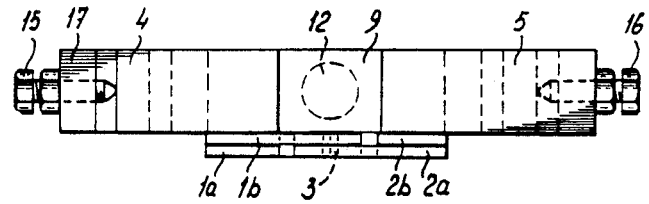
Figure 4:
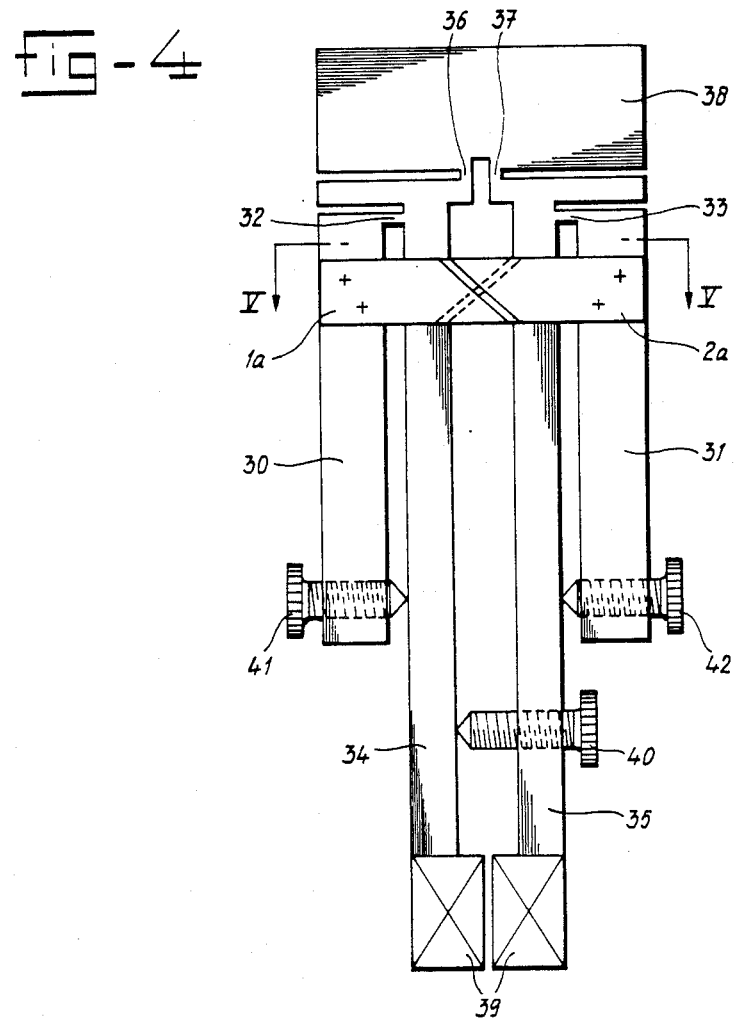
Figure 5:
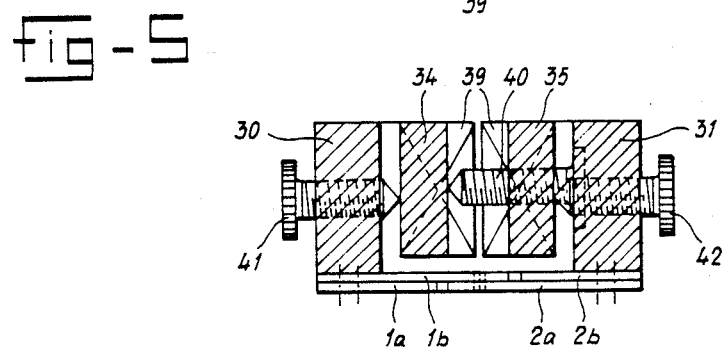

FIG. 1 shows a perspective view of a first embodiment of the device according to the invention.
FIG. 2 shows a front view of part of said device.
FIG. 3 shows a top view.
FIG. 4 shows a front view of a second embodiment.
FIG. 5 is a section along the line V-V in FIG. 4.

The devices shown are microdiaphragms with an adjustable aperture (variable pinhole) the maximum dimensions of which lie between 0.5 and 1,000 μm. The devices can be used, inter alia, in scanning microscopes and electron microscopes, in particular to vary the intensity of a laser beam or to determine the size of an aperture for a detector. By regulating the beam widening, it is possible to vary the aperture of a lens used, and thus the resolution; with maximum resolution the light intensity through the lens can be controlled. It is important that when the dimensions of the aperture is changed it still retaines the same shape. It is also possible to vary the detection resolution by varying such an aperture placed in front of a detector.

The two devices comprise two diaphragm strips, each in the form of a pair of plates 1a, 1b and 2a, 2b. Each of the plates has a slanting end edge, and in the example shown these edges form an angle of 45 and 135 degrees, respectively, with the longitudinal edges of the particular plate. The plates of each pair are bonded together and the slanting end edges together form an angle of 90 degrees. The arrangement shown produces a square aperture 3 whose shape remains square when the pairs of plates are shifted relative to each other. The angle of 45 degrees is not a determining factor for the idea; another angle may also be used so long as the corresponding plates just connect together so that they are parallel and flat. A variable opening or another shape then results.

In the embodiment according to FIGS. 1 to 3 each of the pairs of plates 1a, 1b, 2a, 2b is fixed to a U-shaped transmission lever 4, 5. Each of said levers is connected by means of a tilting point 6, 7 to a rectangular bar structure, comprising a bottom piece 8, a bridge piece 9 and two uprights 10, 11.

The drawing shows clearly that the levers 4, 5 and the bar structure 8, 9, 10, 11 are in one piece, and the tilting points 6, 7 are thinned parts of the material.

A member 12 which can expand and contract in a controlled manner is placed between the bottom piece 8 and the bridge piece 9. The member 12 is preferably a column of piezoelectric crystal tablets. A guide wire 13 extending from an electrical current source is soldered to the column 12 at point 14. It is possible to control the length of the column accurately by varying the electrical current to the column 12. An expansion movement of the column leads to a tilting movement of the levers 4, 5 about the tilting points 6, 7 in a direction in which the pairs of plates 1a, 1b and 2a, 2b move towards each other and the aperture becomes smaller. A retracting movement of the column 12 will, of course, result in an enlargement of the aperture.

Other mechanisms could be used instead of the member 12, for example, an electromagnetic or hydraulic mechanism, but a piezoelectric column is preferable on account of its accurate adjustability over a small distance by means of electrical current.

At zero voltage the size of the aperture will have to have a certain selected value, so the levers 4, 5 can be shifted by means of adjusting screws 15, 16. The adjusting screw 15 projects through a screw-threaded opening into an upright 17 which is integral with the bottom piece 8 and is connected by means of a tilting point 18 to the lever 4. The screw end engages with the lever 4.

The adjusting screw 16 projects through a screw threaded opening into the lever 5; the end of said screw engages with a bar 19 which is only connected to the flange of the U-shaped lever on which the pair of plates 2a, 2b is bonded. This flange is also connected by means of a tilting point 20 to the flange of the lever 5 which runs parallel to the upright 11. It will be clear that if the adjusting screw 15 is screwed further into its opening, the lever 4 will be tilted in such a way about the tilting point 18 that the plates 1a, 1b are shifted towards the plates 2a, 2b. When the adjusting screw 15 is turned back, the elasticity of the material will cause the lever to move backwards in a direction in which the pair of plates 1a, 1b moves away from the pair of plates 2a, 2b.

Further screwing in of the screw 16 results in the top flange of the lever 5 being shifted at point 19 relative to the remainder of said lever. The pair of plates 2a, 2b will then move away from the pair of plates 1a, 1b. The outlet size of the aperture 3 can thus be accurately set with the screws 15, 16.

The symmetrical displacement of the pairs of plates 1a, 1b ; 2a, 2b, and thus the size of the aperture, caused by the expansion and retracting of the column 12 can be very accurately controlled within narrow limits. The square shape of the aperture is retained. There is very great ease of operation. The pinhole can be increased and reduced entirely automatically in a simple manner. The design is therefore excellent for automatic exposure regulation and detector size regulation.

In the embodiment according to FIGS. 4 and 5 the pairs of plate 1a, 1b and 2a, 2b are fixed to two legs 30, 31 which are connected by means of a hinge 32, 33 to two relatively long legs 34, 35 which are in turn connected by means of hinges 36, 37 to a block 38. Disposed at the free end of the legs 34 and 35 is a device 39, by means of which the legs 34, 35 can be moved apart and together in a controlled manner. This device 39 is, for example, an electromagnetic drive unit. The minimum distance between the legs 34 and 35 is determined by means of an adjusting screw 40. This prevents the plates from knocking against each other in such a way that damage occurs.

The distance between the legs 30 and 34 is determined by the adjusting screw 41 and that between the legs 31 and 35 by the adjusting screw 42. It will be clear that the relative displacement of the ends of the legs 34 and 35 is transferred in reduced fashion to the pairs of plates 1a, 1b, 2a, 2b, tilting taking place about the hinges 36 and 37.

The outlet size of the variable pinhole (aperture), i.e. the lozenge-shaped hole (square, rectangular) formed by the plates, can be adjusted by means of screws 41, 42, tilting taking place about the hinges 32, 33. The extent to which the movement of the unit 39 is transferred in reduced fashion to the pairs of plates can be varied by altering the position of the pairs of plates on the legs 30, 31 in the lengthwise direction thereof.

Since the drive unit makes a greater stroke than the envisaged alteration of the pinhole size, use can be made of a relatively simple electromagnetic drive instead of a piezoelectric drive. Apart from the drive unit, the device can be made in one piece by providing seven slits.

Various modifications are possible within the scope of the invention. The pairs of plates bound a lozenge-shaped aperture. Such an aperture could also be determined by a lozenge-shaped or V-shaped recess in two diaphragm strips. It is essential that the lozenge-shaped, preferably square opening 3 is bounded by recesses in a diaphragm strip and that said strips are fixed on or form part of legs which can be moved apart and towards other in a controlled manner.

I claim:

1. A microdiaphragm having an adjustable aperture between 0.5 and 1,000 μm comprising:
   a pair of separate diaphragm strips, each of said diaphragm strips comprising two plates, each of which has a slanting end edge, said plates being fastened to each other so that their end edges lie behind each other and always forming a V-shaped recess, said recesses forming a lozenge-shaped opening,
   transmission legs, each of said diphragm strips being fixed to or forming part of one of said legs, and
   means, coupled to said transmission legs, for shifting said transmissions legs symetrically relative to one another.

2. Microdiaphragm according to claim 1 wherein each of the transmission legs is a U-shaped lever which is symmetrically connected by means of a tilting point to a tilting mechanism.

3. Microdiaphragm according to claim 2, wherein the tilting mechanism comprises a rectangular bar structure with a bottom piece, two uprights standing perpendicular to said bottom piece and connected thereto and to the levers by means of a tilting point, and a bridge piece connected to the uprights and running parallel to the bottom piece, while an expandable member is placed between bottom piece and bridge piece.

4. Microdiahragm according to one of claims 2 or 3, which further includes an adjusting screw connected to each U-shaped lever to permit adjustment of the outlet size of the aperture.

5. Microdiaphragm according to Claim 3, wherein the expandable member is a column of piezo-electrical material which is connected to an electrical current source.

6. Microdiaphragm according to claim 1, which further includes a drive unit, hinges, legs and block, and wherein the transmission legs are connected by means of the hinges to the legs which are connected to the drive unit and which are connected by means of the hinges to the block.

7. Microdiaphragm according to claim 6, wherein the transmission legs, the legs to which the drive unit is connected and the block are made in one piece through the provision of slits.

8. A microdiaphragm having an adjustable aperture between 0.5 and 1,000 μm comprising:
   a pair of separate diaphragm strips, each of said diaphragm strips having a V-shaped recess therein, said recess forming a lozenge-shaped opening,
   transmission legs, each of said diaphragm strips being fixed to or forming part of one of said legs, each said legs comprising a U-shaped lever,
   tilting means, connected to said levers through tilting points, said levers being symetrically connected to said tilting means, and means, coupled to said transmission legs, for shifting said transmission legs symetrically relative to one another.

9. A microdiaphragm according to claim 8, wherein the tilting mechamism comprises a rectangular bar structure with a bottom piece, two uprights standing perpendicular to said bottom piece and connected thereto and to the levers by means of a tilting point, and a bridge piece connected to the uprights and running parallel to the bottom piece, and an expandable member is connected between said bottom piece and said bridge piece.

10. A microdiaphragm according to claim 9, which further includes an adjusting screw connected to each U-shaped lever to permit adjustment of the outlet size of the aperture.

11. A microdiaphragm according to claims 8, further comprising;

an expandable member comprising a column of piezo-electric material connected to said tilting means, and electrical connecting means for coupling current to said piezo-electric material.

12. A microdiaphragm having an adjustable aperture between 0.5 and 1,000 μm comprising:

a pair of separate diaphragm strips, each of said diaphragm strips having a V-shaped recess therein, said recesses forming a lozenge-shaped opening, transmission legs, each of said diaphragm strips being fixed to or forming part of one of said legs, drive legs, first hinge means, said drive legs being connected to said transmission legs through said hinge means, drive means, connected to said drive legs, block means, and second hinge means, said block means connected to said drive legs through said second hinge means.

13. A microdiaphragm according to claim 12, wherein said transmission legs, said drive legs and said block means are all made in one piece and wherein slits therein divide each of said elements.

* * * * *